(12) United States Patent
Lee et al.

(10) Patent No.: US 8,969,947 B2
(45) Date of Patent: Mar. 3, 2015

(54) VERTICAL MEMORY DEVICES WITH QUANTUM-DOT CHARGE STORAGE CELLS

(75) Inventors: Jae-goo Lee, Suwon-si (KR); Jung-dal Choi, Hwaseong-si (KR); Young-woo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 412 days.

(21) Appl. No.: 13/042,051

(22) Filed: Mar. 7, 2011

(65) Prior Publication Data

US 2011/0260237 A1 Oct. 27, 2011

(30) Foreign Application Priority Data

Apr. 27, 2010 (KR) .................. 10-2010-0039167

(51) Int. Cl.
*H01L 29/788* (2006.01)
*H01L 21/28* (2006.01)
(Continued)

(52) U.S. Cl.
CPC .... *H01L 21/28273* (2013.01); *H01L 29/66833* (2013.01); *H01L 29/66825* (2013.01); *H01L 29/42332* (2013.01); *H01L 29/792* (2013.01); *H01L 29/788* (2013.01);
(Continued)

(58) Field of Classification Search
CPC ............ H01L 29/66825; H01L 29/792; H01L 29/7881; H01L 29/42332; H01L 29/7926; H01L 29/66833; H01L 27/11578; H01L 27/11521; H01L 27/11551; H01L 29/788; H01L 27/11524; H01L 21/28282; H01L 27/1157; H01L 29/7889; H01L 27/11568; H01L 29/42324; H01L 27/115; H01L 29/513; H01L 29/4234; H01L 21/8221; H01L 29/7883; H01L 27/10; H01L 27/112; H01L 29/42348; H01L 29/512; B82Y 10/00; G11C 16/0416; G11C 16/0466; G11C 16/0483; Y10S 438/962; Y10S 977/774
USPC .............. 257/324, 326, E29.309; 365/185.05
See application file for complete search history.

(56) References Cited

U.S. PATENT DOCUMENTS 7,615,446 B2 * 11/2009 Kim et al. ..................... 438/257
2006/0040103 A1 * 2/2006 Whiteford et al. ............ 428/403
(Continued)

FOREIGN PATENT DOCUMENTS

| JP | 2007-266143 | 10/2007 |
| KR | 1020090047614 A | 5/2009 |
| KR | 1020090105734 A | 10/2009 |

OTHER PUBLICATIONS

Capalletti et al Flash Memories. USA: Kluwer Academic Publishers, 2002.*

*Primary Examiner* — Fei Fei Yeung Lopez
(74) *Attorney, Agent, or Firm* — Myers Bigel Sibley & Sajovec, P.A.

(57) ABSTRACT

A memory device includes a substrate, a semiconductor column extending perpendicularly from the substrate and a plurality of spaced-apart charge storage cells disposed along a sidewall of the semiconductor column. Each of the storage cells includes a tunneling insulating layer disposed on the sidewall of the semiconductor column, a polymer layer disposed on the tunneling insulating layer, a plurality of quantum dots disposed on or in the polymer layer and a blocking insulating layer disposed on the polymer layer.

18 Claims, 14 Drawing Sheets

(51) Int. Cl.
   *H01L 29/66* (2006.01)
   *H01L 29/423* (2006.01)
   *H01L 29/792* (2006.01)
   *H01L 27/115* (2006.01)
   *B82Y 10/00* (2011.01)

(52) U.S. Cl.
   CPC ....... *H01L 29/7881* (2013.01); *H01L 29/7926* (2013.01); *H01L 27/11521* (2013.01); *H01L 27/11578* (2013.01); *H01L 21/28282* (2013.01); *H01L 27/1157* (2013.01); *B82Y 10/00* (2013.01); *H01L 27/11524* (2013.01); *H01L 27/11551* (2013.01); *H01L 27/11556* (2013.01)

USPC ........... 257/325; 257/315; 257/314; 257/321; 257/261; 257/239; 257/324; 257/E29.309; 257/E29.109; 257/E21.179; 257/E21.18; 257/E21.422; 257/E21.423; 257/E21.68; 257/E21.681; 257/E29.129; 257/E29.3

(56) References Cited

U.S. PATENT DOCUMENTS

| | | | |
|---|---|---|---|
| 2008/0173928 A1* | 7/2008 | Arai et al. | 257/316 |
| 2009/0121271 A1* | 5/2009 | Son et al. | 257/315 |
| 2009/0251963 A1* | 10/2009 | Seol et al. | 365/185.05 |

* cited by examiner

_US 8,969,947 B2_

VERTICAL MEMORY DEVICES WITH QUANTUM-DOT CHARGE STORAGE CELLS

CROSS-REFERENCE TO RELATED APPLICATIONS

This application claims the benefit of Korean Patent Application No. 10-2010-0039167, filed on Apr. 27, 2010, in the Korean Intellectual Property Office, the disclosure of which is incorporated herein in its entirety by reference.

BACKGROUND OF THE INVENTION

The inventive subject matter relates to memory devices and, more particularly, to memory devices with a vertical structure.

Electronic devices have decreased in size while being required to process increasingly large amounts of data. Thus, non-volatile memory devices for use in such electronic devices need to be more highly integrated. To this end, non-volatile memory devices having a vertical structure with multiple levels have been proposed to replace more conventional flat (single-level) structure.

SUMMARY OF THE INVENTION

In some embodiments of the inventive subject matter, a memory device includes a substrate, a semiconductor column extending perpendicularly from the substrate and a plurality of spaced-apart charge storage cells disposed along a sidewall of the semiconductor column. Each of the storage cells includes a tunneling insulating layer disposed on the sidewall of the semiconductor column, a polymer layer disposed on the tunneling insulating layer, a plurality of quantum dots disposed on or in the polymer layer (e.g., bonded to ligands of the polymer layer) and a blocking insulating layer disposed on the polymer layer. The device further includes a plurality of gate electrodes, respective ones of which are disposed on respective ones of the charge storage cells. The semiconductor column, the plurality of charge storage cells and the gate electrodes may form a NAND string. In some embodiments, the memory device further includes a plurality of interlayer insulating layers, respective ones of which are disposed between adjacent ones of the charge storage cells.

In some embodiments, the polymer layer extends along the sidewall of the semiconductor column to contact adjacent ones of the interlayer insulating layers. The blocking insulating layer may conform to the polymer layer and extend on to walls of the adjacent interlayer insulating layers perpendicular to the sidewall of the semiconductor column.

In some embodiments, the plurality of spaced-apart charge storage cells includes a first plurality of charge storage cells spaced along a first sidewall of the semiconductor column and a second plurality of charge storage cells spaced along a second sidewall of the semiconductor column. The first and second pluralities of charge storage cells may be arranged symmetrically on respective first and second opposite sides of the semiconductor column. The substrate may include a conductive layer and the semiconductor column may be disposed on and directly in contact with the conductive layer.

In further embodiments, the semiconductor column includes a plurality of semiconductor columns arrayed on the substrate and the plurality of spaced-apart charge storage cells includes respective pluralities of charge storage cells spaced along sidewalls of respective ones of the semiconductor columns. The plurality of gate electrodes may include respective gate electrode layers disposed adjacent charge storage cells of respective layers of the charge storage cells. The device may further include a plurality of interlayer insulating layers, respective ones of which are disposed between adjacent layers of the charge storage cells. The semiconductor columns, the charge storage regions and the gate electrode layers may form a plurality of NAND strings. The substrate may include a conductive layer and the semiconductor columns may be disposed on and directly contact the conductive layer, such that the conductive layer serves as a common source line.

In further embodiments, a memory device includes a semiconductor layer and at least one semiconductor column extending along a first direction with respect to the semiconductor layer. A plurality of storage cells are spaced along a sidewall of the at least one semiconductor column, each of the plurality of storage cells including a charge storage layer including a polymer layer and quantum dots bonded thereto. Interlayer insulating layers are disposed along the sidewall of the semiconductor column between adjacent ones of the storage cells and extend in a second direction perpendicular to the first direction. Respective tunneling insulating layers may be disposed between respective ones of the charge storage layers and the semiconductor column, the device may further include respective blocking insulating layers disposed on respective ones of the charge storage layers. Respective gate electrode layers may be disposed on respective ones of the blocking insulating layers.

Additional embodiments provide a memory device include a semiconductor layer and at least one semiconductor column extending in a first direction with respect to the semiconductor layer. Storage cells are spaced along the semiconductor column and respective ones of a plurality of gate electrodes are disposed on respective ones of the plurality of storage cells. The device further includes a plurality of interlayer insulating layers, respective ones of which are disposed between respective adjacent ones of the gate electrodes. Each of the storage cells includes a tunneling insulating layer disposed on the semiconductor column, a charge storage layer disposed on the tunneling insulating layer and including a polymer layer having quantum dots bonded thereto and a blocking insulating layer disposed on the charge storage layer.

In further embodiments, a memory device includes a semiconductor layer, at least one semiconductor column extending perpendicular to the semiconductor layer and a charge storage structure including a polymer layer disposed on a sidewall of the semiconductor column and a plurality quantum dots bonded to the polymer layer.

According to another aspect of the inventive subject matter, there is provided a card including a memory unit that includes one of the above non-volatile memory devices and a controller that controls the memory device and exchanges data with the memory unit.

According to another aspect of the inventive subject matter, there is provided a system including a memory unit that includes one of the above non-volatile memory devices, a processor that communicates with the memory unit via a bus, and an input/output device that communicates with the bus.

BRIEF DESCRIPTION OF THE DRAWINGS

Exemplary embodiments of the inventive subject matter will be more clearly understood from the following detailed description taken in conjunction with the accompanying drawings in which.

DETAILED DESCRIPTION

Figure 1:
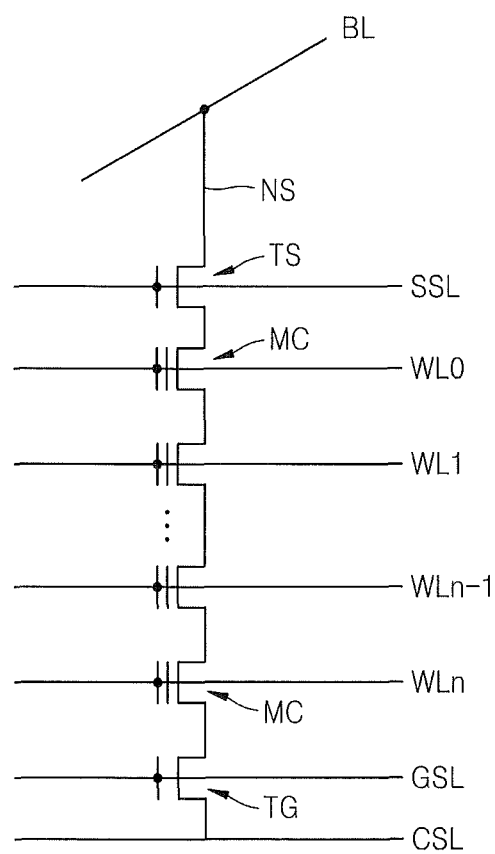
FIG. 1 is a circuit diagram of a non-volatile memory device having a vertical structure, according to some embodiments of the inventive subject matter.

Reference will now be made in detail to exemplary embodiments of the inventive subject matter, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive subject matter.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a non-volatile memory device having a vertical structure according to some embodiments of the inventive subject matter.

Referring to FIG. 1, a NAND string NS may extend in the vertical direction, that is, it may have a vertical structure. The NAND string NS may have a string selection transistor TS, a plurality of memory cells MC, and a ground selection transistor TG. A bit line BL may be connected to one end of the NAND string NS and a common source line CSL may be connected to the other end of the NAND string NS.

The memory cells MC may be arranged in series in the vertical direction. The memory cells MC may store data. A plurality of word lines WL0, WL1, . . . , WLn−1, WLn may be electrically connected to the memory cells MC so as to control respective ones of the memory cells MC. The total number of the memory cells MC may be appropriately determined according to the capacity of the non-volatile memory device.

The string selection transistor TS may be arranged near one end of the memory cells MC. For example, the string selection transistor TS may be located between the bit line BL and the memory cells MC and may be connected in series with the memory cells MC. The string selection transistor TS may control an exchange of signals between the bit line BL and the memory cells MC. A string selection line SSL may be electrically connected to the string selection transistor TS. The ground selection transistor TG may be located at an opposite end of the string with respect to the string selection transistor TS. For example, the ground selection transistor TG may be located between the common source line CSL and the memory cells MC and may be connected in series with the memory cells MC. The ground selection transistor TG may control an exchange of signals between the common source line CSL and the memory cells MC. A ground selection line GSL may be electrically connected to the ground selection transistor TG.

For example, in order to perform a programming operation, 0 V may be applied to the bit line BL, an 'ON' voltage may be applied to the string selection line SSL, and an 'OFF' voltage may be applied to the ground selection line GSL. The 'ON' voltage may be equal to or greater than a threshold voltage of the memory cells MC so as to turn on the string selection transistor TS, and the 'OFF' voltage may be less than the threshold voltage so as to turn off the ground selection transistor TG. A program voltage may be applied to a memory cell MC selected from among the memory cells MC, and a pass voltage may be applied to the other memory cells MC. When the program voltage is applied to the selected memory cell MC, electric charges may be injected into the selected memory cell MC due to Fowler-Nordheim (FN) tunneling. The pass voltage may be greater than the threshold voltage.

In order to perform a read operation, a read voltage may be applied to the bit line BL, and the 'ON' voltage may be applied to the string selection line SSL and the ground selection line GSL. A reference voltage may be applied to a memory cell MC selected from among the memory cells MC, and the pass voltage may be applied to the other memory cells.

In order to perform an erase operation, an erase voltage may be applied to the memory cells MC and 0 V may be applied to the word lines WL0, WL1 through to WLn-1, and WLn. Thus, data may be simultaneously erased from the all of memory cells MC.

The 'ON' voltage, the 'OFF' voltage, the program voltage, the pass voltage, the read voltage, and the erase voltage may be less than, for example, 20 V, with the voltages being determined according to the properties of the non-volatile memory device.

Figure 2:
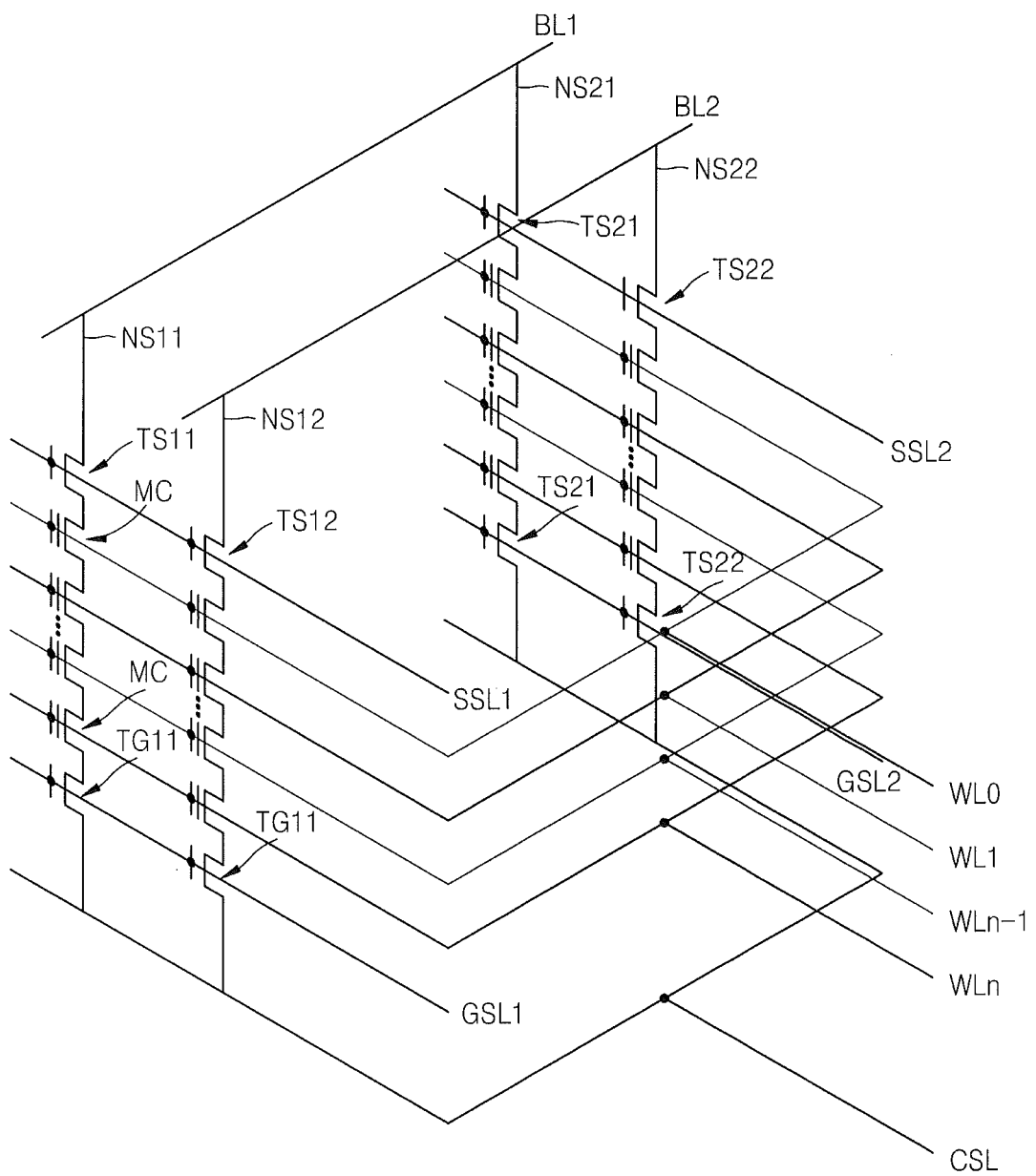
FIG. 2 is a circuit diagram of a non-volatile memory device having a vertical structure, according to some embodiments of the inventive subject matter.

FIG. 2 is a circuit diagram of a non-volatile memory device having a vertical structure according to some embodiments of the inventive subject matter. The non-volatile memory device of FIG. 2 may include an array of strings of non-volatile memory devices as shown in FIG. 1. Thus, a description of the operations or characteristics of elements that are the same as those of FIG. 1 will not be provided here.

Referring to FIG. 2, a plurality of NAND strings NS11, NS12, NS21, and NS22 each having a vertical structure may be arranged in a matrix. A first bit line BL1 may be commonly electrically connected to one end of the NAND strings NS11 and NS21 in a first row, and a second bit line BL2 may be commonly electrically connected to one end of the NAND strings NS12 and NS22 in a second row. A common source line CSL may be commonly electrically connected to opposite ends of the NAND strings NS11, NS12, NS21, and NS22. The total number of the NAND strings NS11, NS12, NS21, and NS22 and the total number of the bit lines BL1 and BL2 are just examples thereof, and the inventive subject matter is not limited thereto.

Respective word lines WL0, WL1 through to WLn-1, and WLn may be commonly electrically connected to memory cells MC on respective levels. A first string selection line SSL1 may be commonly electrically connected to string selection transistors TS11 and TS12 of the NAND strings NS11 and NS12 in the first row. A second string selection line SSL2 may be commonly electrically connected to string selection transistors TS21 and TS22 of the NAND strings NS21 and NS22 in the second row. A first ground selection line GSL1 may be commonly electrically connected to ground selection transistors TG11 and TG12 of the NAND strings NS11 and NS12 in the first row. A second ground selection line GSL2 may be commonly electrically connected to ground selection transistors TG21, and TG22 of the NAND strings NS21 and NS22 in the second row.

In order to perform a program operation, 0 V may be applied to a bit line selected from the bit lines BL1 and BL2, and an 'ON' voltage may be applied to the other bit line for channel boosting. Also, the 'ON' voltage may be applied to a string selection line selected from the string selection lines SSL1 and SSL2 and an 'OFF' voltage may be applied to the other string selection line. Thus, it is possible to selectively operate a NAND string that is commonly connected to the selected bit line and string selection line from among the NAND strings NS11, NS12, NS21, and NS22.

In order to perform a read operation, a read voltage may be applied to a bit line selected from the bit lines BL1 and BL2 and the other bit line may be floated. Also, the 'ON' voltage may be applied to a string selection line selected from the string selection lines SSL1 and SSL2 and the 'OFF' voltage may be applied to the other string selection line. Thus, it is possible to selectively operate a NAND string that is commonly connected to the selected bit line and string selection line from among the NAND strings NS11, NS12, NS21, and NS22.

In order to perform an erase operation, an erase voltage may be applied to the memory cells MC and 0 V may be applied to the word lines WL0, WL1, ..., WLn-1, and WLn. Accordingly, data may be erased from the memory cells MC of the NAND strings NS11, NS12, NS21, and NS22 at the same time.

Figure 3:
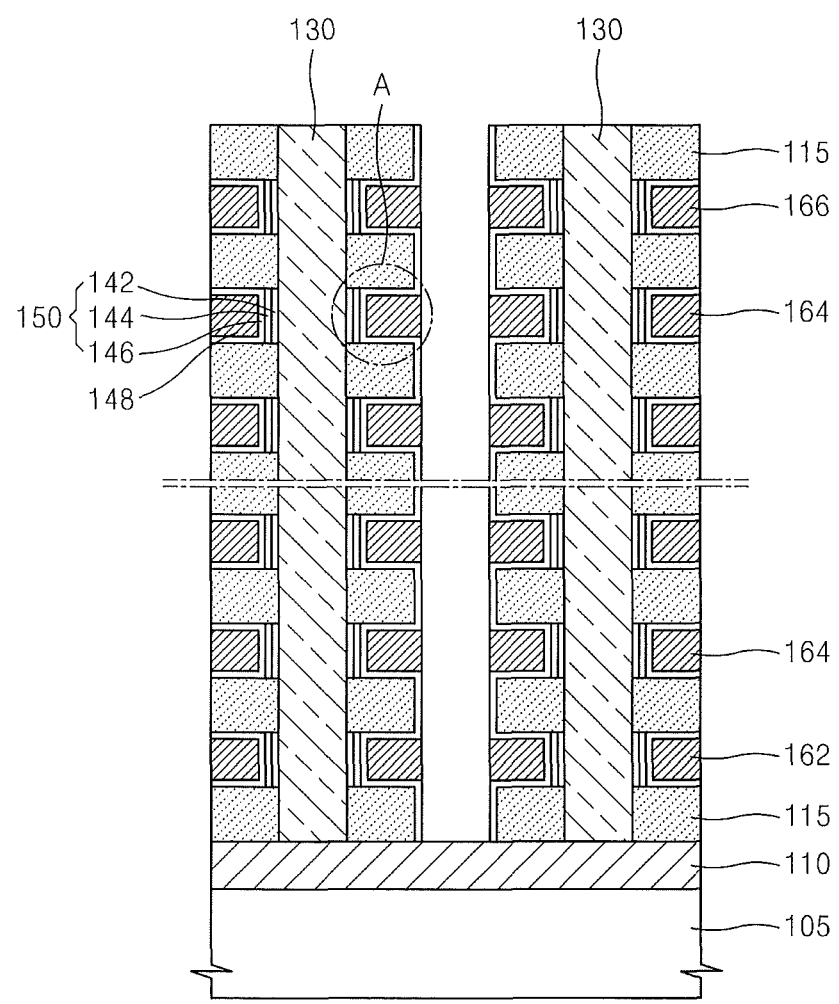
FIG. 3 is a schematic cross-sectional view of the non-volatile memory device of FIG. 2, taken along a bit line direction.
Figure 4:
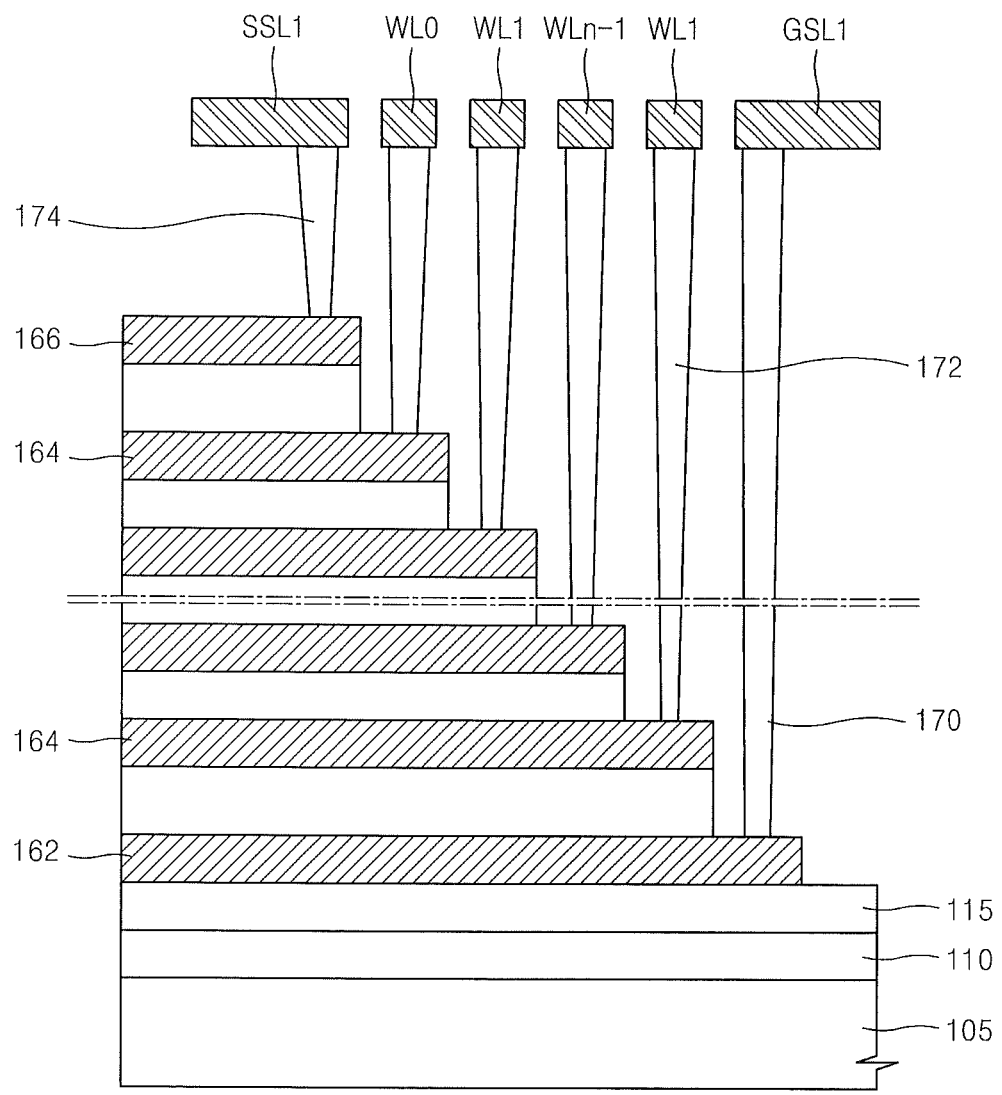
FIG. 4 is a schematic cross-sectional view of the non-volatile memory device of FIG. 2, taken along a word line direction.

FIG. 3 is a schematic cross-sectional view of the non-volatile memory device having the vertical structure of FIG. 2, taken along a bit line direction. FIG. 4 is a schematic cross-sectional view of the non-volatile memory device having the vertical structure of FIG. 2, taken from a direction of word lines.

Referring to FIGS. 2 to 4, a semiconductor layer 105 may be prepared. The semiconductor layer 105 may be a substrate or may be formed of a semiconductor material, e.g., a Group IV semiconductor, a Group III-V compound semiconductor, or a Group II-VI oxide semiconductor. For example, the Group IV semiconductor may include silicon, germanium, or silicon-germanium. The semiconductor layer 105 may include at least one selected from the group consisting of a bulk wafer, an epitaxial layer, a silicon-on-insulator (SOI) layer, and a semiconductor-on-insulator (SEOI) layer.

A plurality of semiconductor columns 130 may be formed on the semiconductor layer 105 to extend perpendicular to the semiconductor layer 105. The NAND strings NS11, NS12, NS21, and NS22 of FIG. 2 may be formed on the sidewalls of the semiconductor columns 130 along the semiconductor columns 130. The semiconductor layer 105 may include an impurity-doped region 110 below the semiconductor columns 130. The impurity-doped region 110 may provide one or more source region and may form a PN junction together with another region of the semiconductor layer 105. The common source line CSL of FIG. 2 may be connected to the impurity-doped region 110.

Alternatively, the source regions may be respectively formed in a lowermost portion of each semiconductor column 130, and the impurity-doped region 110 may function as the common source line CSL. Although not shown, a plurality of drain regions may be respectively formed in an uppermost portion of each semiconductor column 130 and may be connected to the bit line BL1 of FIG. 2.

The memory cells MC may include a plurality of storage cells 150 on the sidewalls of the semiconductor columns 130, and a plurality of control gate electrodes 164 on the storage cells 150. Each of the storage cells 150 may include a tunneling insulating layer 142 on a sidewall of one of the semiconductor columns 130, a charge storage layer 144 on the tunneling insulating layer 142, and a blocking insulating layer 146 on the charge storage layer 144. The storage cells 150 will be described in detail later with reference to FIGS. 6A to 6D.

A PN junction source/drain region formed by impurity doping may not be formed around the surfaces of the semiconductor columns 130 between the control gate electrodes 164. Thus, the semiconductor columns 130 in the memory cells MC may be continuously doped with impurities of the same conductive type in order to form a well or a channel. In this case, the semiconductor columns 130 between the memory cells MC may be electrically connected using a field effect source/drain region during a program/read operation. The surfaces of the semiconductor columns 130 between the memory cells MC may provide a turn on function using an electric field, which is formed in the lateral direction of the control gate electrodes 164, i.e., a fringing field.

The charge storage layers 144 may have a charge storing capability. For example, the charge storage layers 144 may be charge trapping layers and may include a silicon nitride layer, quantum dots, or nanocrystals. The quantum dots or nanocrystals may be formed of a conductive material, e.g., fine metal or semiconductor particles. Each of the tunneling insulating layers 142 and the blocking insulating layers 146 may include an oxide layer, a nitride layer, or a high-K layer. The high-K layer may be a dielectric layer, the dielectric constant of which is greater than those of an oxide layer and a nitride layer.

The string selection transistors TS11, TS12, TS21, and TS22 may include a plurality of string selection gate electrodes 166 on the sidewalls of the semiconductor columns 130. The ground selection transistors TG11, TG12, TG21, and TG22 may include a plurality of ground selection gate electrodes 162 on the sidewalls of the semiconductor columns 130.

A PN junction source/drain region formed by impurity doping may not be formed around the surfaces of the semiconductor columns 130 not only between the memory cells MC but also among the string selection transistors TS11, TS12, TS21, and TS22, the memory cells MC and the ground selection transistors TG11, TG12, TG21, and TG22. Instead, the semiconductor columns 130 between the memory cells MC may be electrically connected using the field effect source/drain region during a program/read operation, as described above.

The storage cells 150 between the string selection transistors TS11, TS12, TS21, and TS22 and the semiconductor columns 130 and between the ground selection transistors TG11, TG12, TG21, and TG22 and the semiconductor columns 130 may function as gate insulating layers and may thus be replaced with one insulating layer. A plurality of interlayer dielectric layers 115 may be formed among the ground selection gate electrodes 162, the control gate electrodes 164 and the string selection gate electrodes 166. The storage cells 150 may extend along the surfaces of the interlayer dielectric layers 115.

The string selection gate electrodes 166 may be commonly connected to the first string selection line SSL1 via contact plugs 174. The control gate electrodes 164 may be respectively connected to the word lines WL0, WL1, through to WLn−1, and WLn via contact plugs 172. The ground selection gate electrodes 162 may be connected to the first ground selection line GSL1 via contact plugs 170.

FIGS. 5A through 5F are schematic cross-sectional views illustrating a method of fabricating a non-volatile memory device having a vertical structure, according to some embodiments of the inventive subject matter.

Figure 5A:
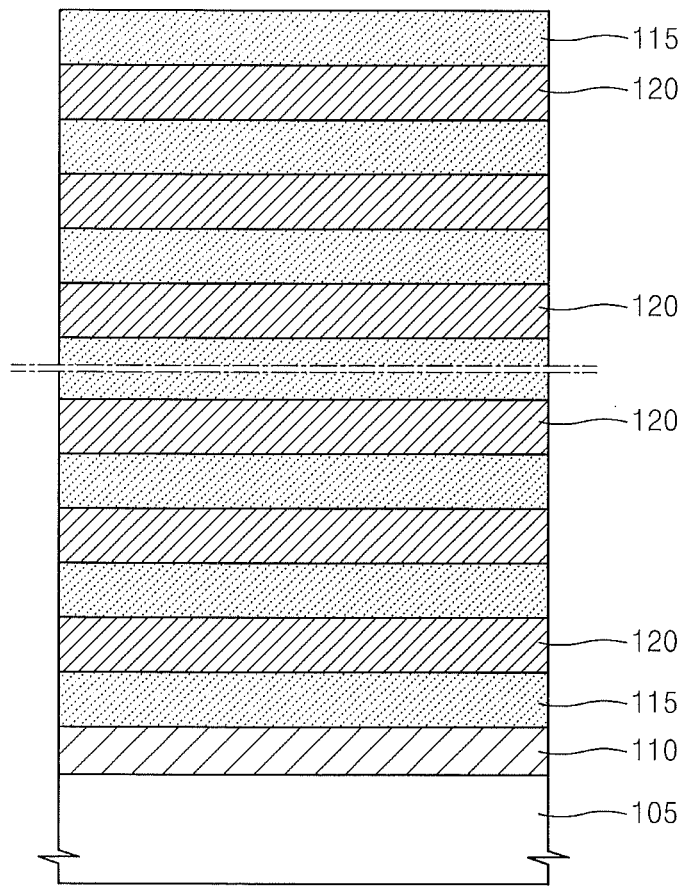
FIGS. 5A through 5F are schematic cross-sectional views illustrating operations for fabricating a non-volatile memory device having a vertical structure according to some embodiments of the inventive subject matter.

Referring to FIG. 5A, an impurity-doped region 110 may be defined by implanting impurities into an upper part of a semiconductor layer 105. Next, interlayer dielectric layers 115 and sacrificial layers 120 may be alternately formed on the semiconductor layer 105. The sacrificial layers 120 may have an etch selectivity with respect to the interlayer dielectric layers 115. In particular, the sacrificial layers 120 may have an etch selectivity with respect to the interlayer dielectric layers 115 when the sacrificial layers 120 are removed by wet etching and may not have an etch selectivity with respect to the interlayer dielectric layers 115 when the sacrificial layers 120 are removed by dry etching. The interlayer dielectric layers 115 may be oxide layers formed of, for example, a silicon oxide, and the sacrificial layers 120 may be nitride layers formed of, for example, a silicon nitride, and vice versa.

Figure 5B:
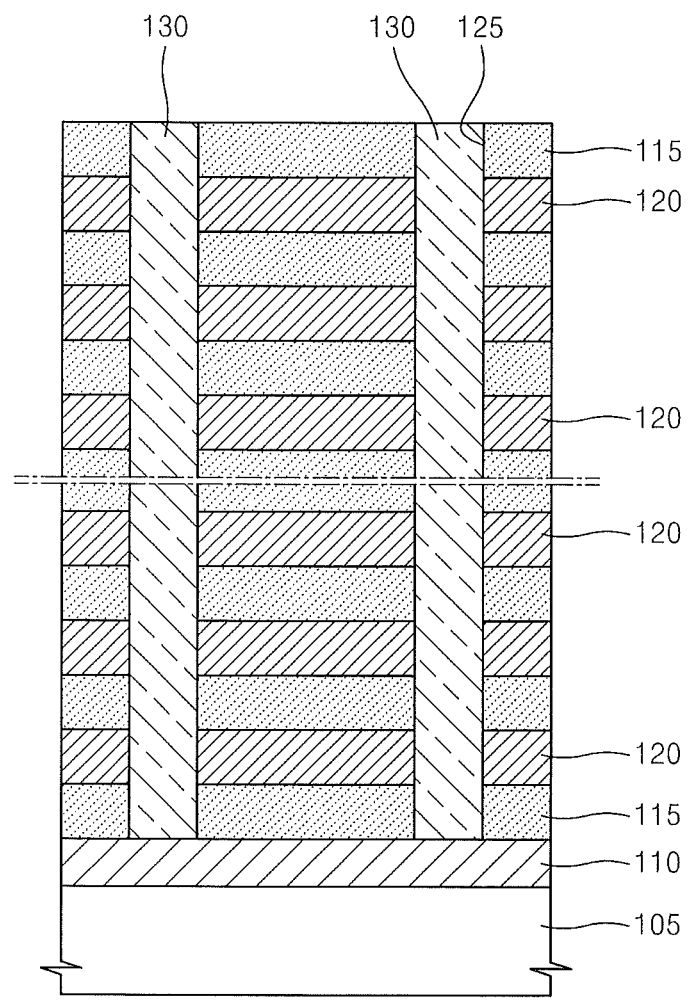

Referring to FIG. 5B, a plurality of first holes 125 may be formed by etching the interlayer dielectric layers 115 and the sacrificial layers 120. The first holes 125 may be obtained using photolithography and etching processes. Next, a plurality of semiconductor columns 130 may be formed to be filled into the holes 125. For example, the semiconductor columns 130 may be epitaxial layers having a polycrystalline or monocrystalline structure. Also, the semiconductor columns 130 may be formed of a silicon material or a silicon-germanium material. The semiconductor columns 130 may function as channel layers.

Figure 5C:
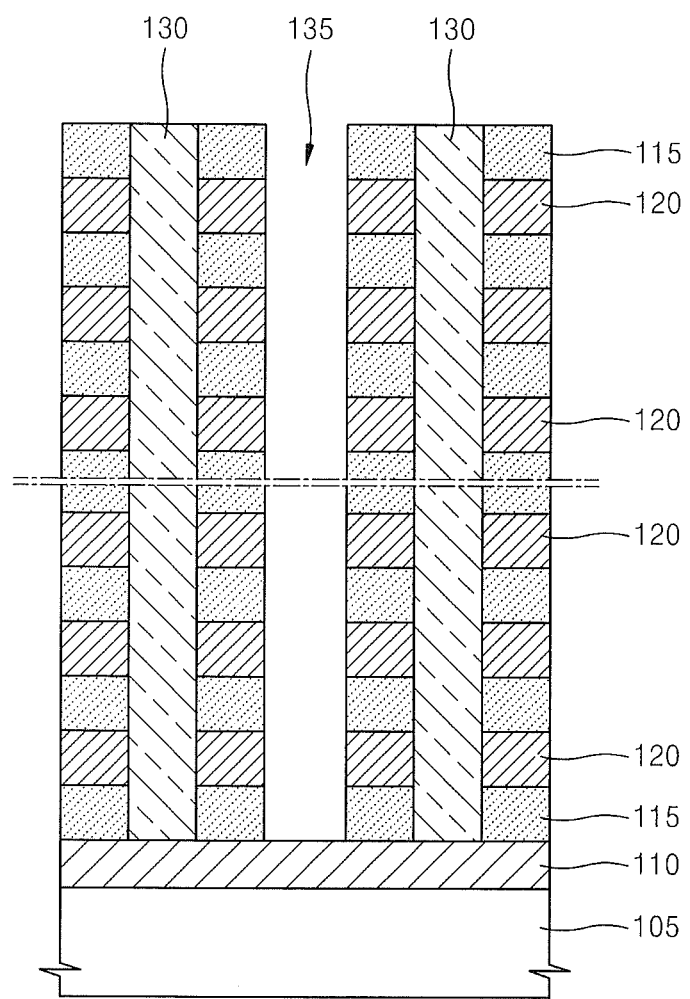

Referring to FIG. 5C, a plurality of second holes 135 may be formed by etching the interlayer dielectric layers 115 and the sacrificial layers 120 between the semiconductor columns 130. The second holes 135 may be obtained using the photolithography and etching processes.

Figure 5D:
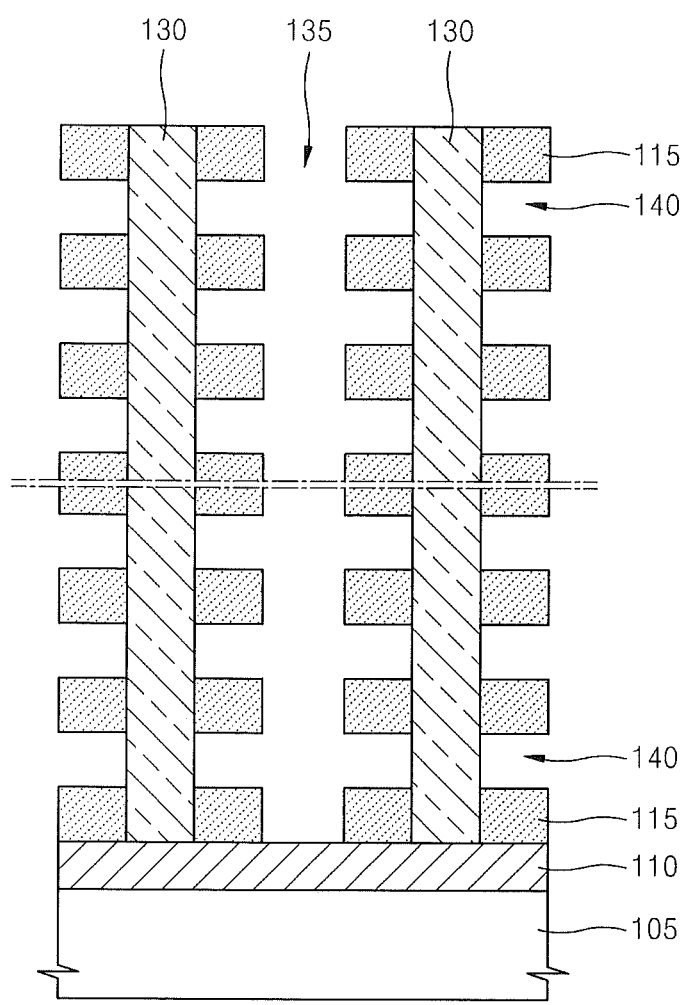

Referring to FIG. 5D, the sacrificial layers 120 may be removed. For example, the sacrificial layers 120 may be removed by permeating an etchant between the interlayer dielectric layers 115 via the second holes 135 by using isotropic etching. For example, isotropic etching may include wet etching, chemical dry etching, or dry etching. Thus, the sacrificial layers 120 between the interlayer dielectric layers 115 may be removed to form a plurality of tunnels 140 connected to the second holes 135. The tunnels 140 may expose the sidewalls of the semiconductor columns 130.

Figure 5E:
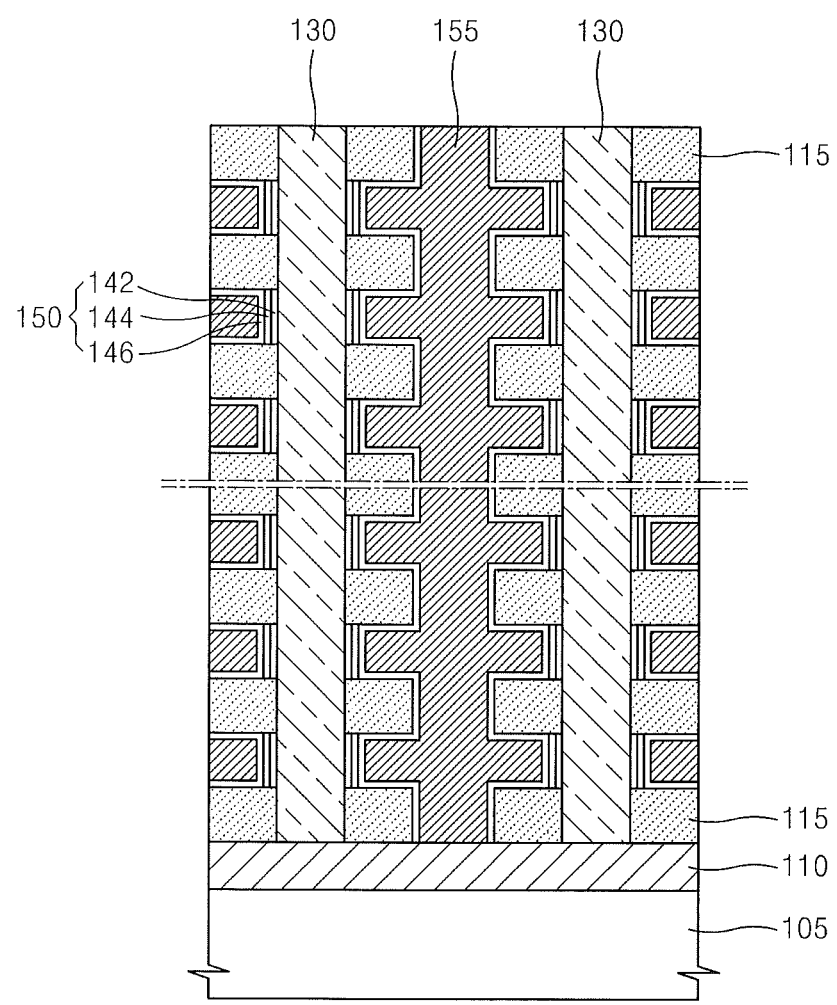

Referring to FIG. 5E, a plurality of storage cells 150 may be formed on the sidewalls of the interlayer dielectric layers 115 and the semiconductor columns 130, which are exposed via the second holes 135 of FIG. 5D and the tunnels 140 of FIG. 5D. The storage cells 150 may be obtained by sequentially forming a tunneling insulating layer 142, a charge storage layer 144 and a blocking insulating layer 146. Next, a conductive layer 155 may be formed on the storage cells 150.

For example, the storage cells 150 and the conductive layer 155 may be obtained using chemical vapor deposition (CVD), an electroplating method, or a spin coating method to achieve good step coverage. The storage cells 150 will be described in detail later. A reactive source for forming the conductive layer 155 may be supplied in a direction from the top of the second holes 135 to the bottom thereof. Thus, in order to form the conductive layer 155 in the tunnels 140 of FIG. 5D without causing a void, the second holes 135 should not be blocked before the tunnels 140 are filled with the conductive layer 155. To this end, process conditions, such as a temperature and gas pressure of the reactive source, should be controlled appropriately.

Figure 5F:
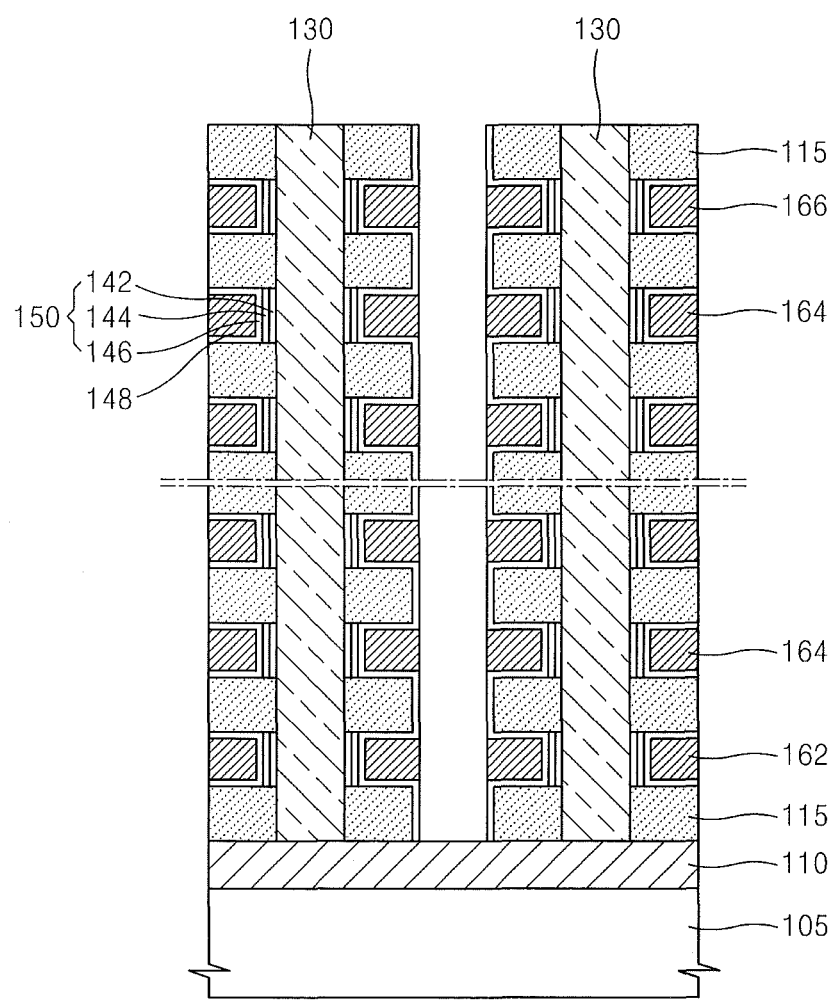

Referring to FIG. 5F, ground selection gate electrodes 162, control gate electrodes 164, and string selection gate electrodes 166 may be formed by selectively etching the conductive layer 155 of FIG. 5E.

FIGS. 6A to 6D illustrate in detail a region A of FIG. 3 for explaining a method of forming the storage cells 150, according to some embodiments of the inventive subject matter.

Figure 6A:
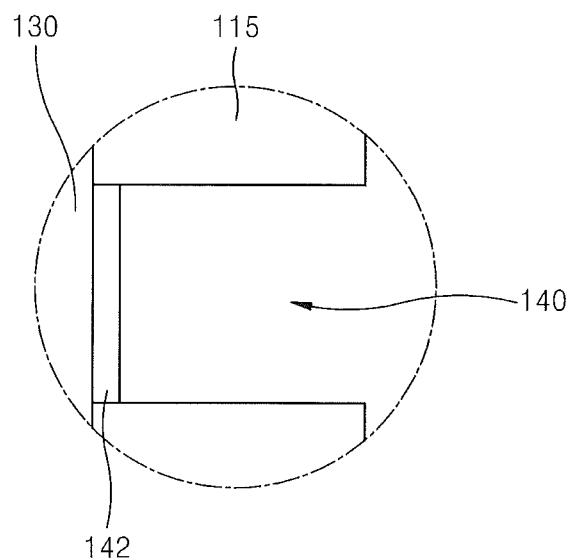
FIGS. 6A to 6D illustrate in detail a region A of FIG. 3 according to some embodiments of an inventive subject matter.

Referring to FIG. 6A, a tunneling insulating layer 142 is formed on an exposed region of a semiconductor column 130. The tunneling insulating layer 142 may be formed on a sidewall of the semiconductor column 130 that extends in the vertical direction, may be formed to not cover a surface of an interlayer insulating layer 115 that extends in the horizontal direction, or may be formed to not cover at least the entire interlayer insulating layer 115. The tunneling insulating layer 142 may be formed by thermal oxidation or CVD. Although not shown, the tunneling insulating layer 142 may be a single layer or a multi-level layer. The tunneling insulating layer 142 may be formed of a material different from that of the interlayer insulating layer 115.

Figure 6B:
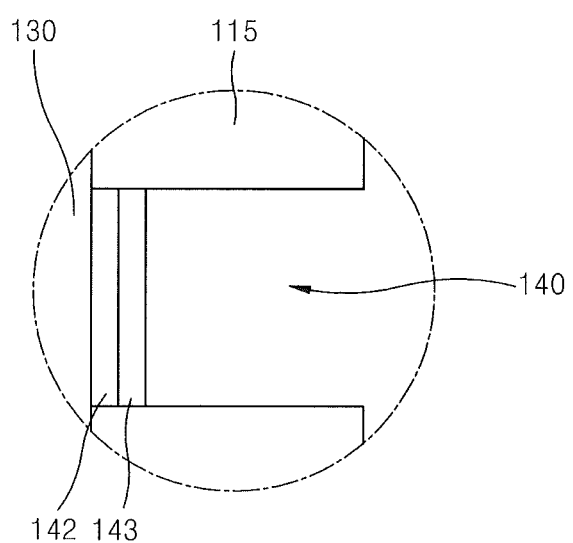

Referring to FIG. 6B, a polymer layer 143 may be formed on the tunneling insulating layer 142. The polymer layer 143 may be formed on a sidewall of the tunneling insulating layer 142 that extends in the vertical direction, may be formed to not cover the horizontally extending surface of the interlayer insulating layer 115 that extends in the horizontal direction, or may be formed to not cover at least the entire interlayer insulating layer 115. The polymer layer 143 may be formed by spin coating. In the spin coating, acetone, cyclopentanone, cyclohexanone, methylethylketone, ethylcellosolveacetate, butylacetate, ethyleneglycol, toluene, xylene, chloroform, tetrahydrofuran, dimethylformamide, acetonitrille, and/or chlorobenzene may be used as a solvent.

The polymer layer 143 may be formed in such a manner that the tunnel 140 is not completely filled with the polymer layer 143. For example, the polymer layer 143 may be formed by implanting a polymer, the volume of which is less than that defined by the tunnel 140, into the tunnel 140. Then, the implanted polymer is adsorbed only by a side wall of the tunneling insulating layer 142 due to a capillary phenomenon and surface tension generated in the tunnels 140 that are fine tunnels, thereby forming the polymer layer 143 only on the tunneling insulating layer 142. If the interlayer insulating layer 115 and the tunneling insulating layer 142 are formed of different materials, then the polymer layer 143 may be formed using a polymer that is easily adsorbed by the tunneling insulating layer 142 but is hardly adsorbed by the interlayer insulating layer 115. Otherwise, the polymer layer 143 may be formed by filling the tunnels 140 with the polymer, hardening the polymer if necessary, and removing a part of the polymer by using an appropriate solvent. If needed, the polymer layer 143 may be cured to be hardened. The polymer layer 143 may be formed of polyolefin, polyester, polysilicone, polyacryl, polystyrene, polyvinyl chloride, polyvinylidene chloride, polyvinyl acetate, fluoroplastics, phenol, urea, melamine, epoxy, polyurethane, polyamide, polyacrylate, polyketone, polyimide, polysulfone, polycarbonate, polyacetal, polyphenylacetylene, polythiophene, and/or derivatives thereof but the inventive subject matter is not limited thereto. Such polymers may include a ligand or moieties, and quantum dots may be bonded to the ligand or moieties as will be described below. The ligand or moieties may include phosphoric acid, carboxylic acid, amine, phosphine, a phosphine oxide, carbamate, urea, pyridine, isocyanate, amide, nitro, pyrimidine, imidazole, salen, dithiolene, catechol, N,O-chelate ligand, P,N-chelate ligand, and/or thiol.

Figure 6C:
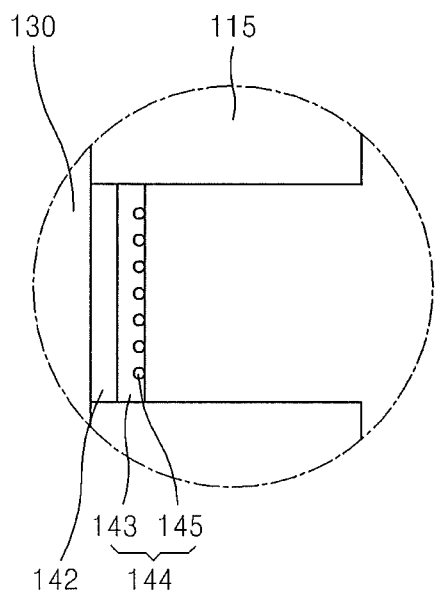

Referring to FIG. 6C, quantum dots 145 are formed in or on the polymer layer 143. The quantum dots 145 may be bonded to the ligand or moieties of the polymer layer 143. Thus, the quantum dots 145 may be formed on a sidewall of the polymer layer 143 that extends in the vertical direction, and may not be formed on the surface of the interlayer insulating layer 115 that extends in the horizontal direction. The polymer layer 143 and the quantum dots 145 may form a charge storage layer 144. The quantum dots 145 may have charge storing capabilities. For example, each of the quantum dots 145 may have a diameter of about 1 nm to about 30 nm. The quantum dots 145 may be formed of a metallic material, such as platinum (Pt), palladium (Pd), nickel (Ni), ruthenium (Ru), cobalt (Co), chrome (Cr), molybdenum (Mo), tungsten (W), manganese (Mn), iron (Fe), osmium (Os), iridium (Ir), tantalum (Ta), tin (Sn), gold (Au), and/or silver (Ag); a semiconductor material, such as silicon (Si), germanium (Ge), silicon carbide (SiC), and/or silicon-germanium (SiGe); and/or a high-K material, such as $SiO_2$, $HfO_2$, $ZrO_2$, $Al_2O_3$, HfSiO, HfSiON, HfON, and/or HfAlO. In some embodiments, multiple polymer layers 143 and/or or multiple quantum dot layers 145 may used in the charge storage layer 144.

Figure 6D:
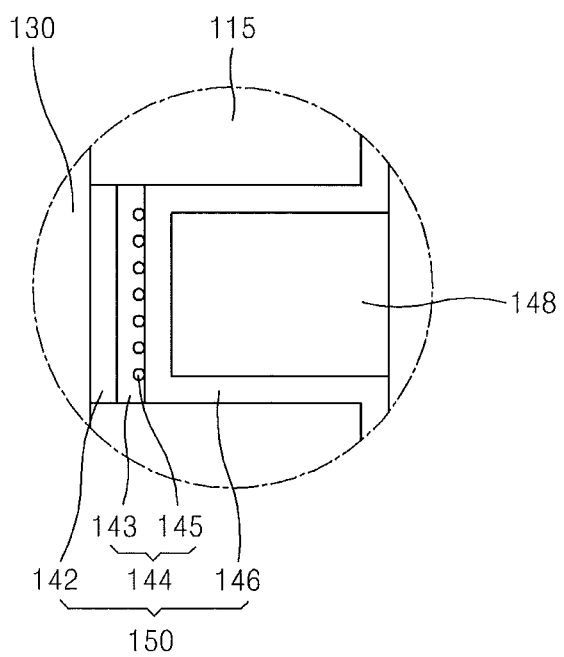

Referring to FIG. 6D, a blocking insulating layer 146 is formed on the polymer layer 143, the quantum dots 145, and the interlayer insulating layer 115. The blocking insulating layer 146 may include, for example, $SiO_2$, SiON, $Si_3N_4$, $Al_2O_3$, AlN, $HfO_2$, HfSiO, HfSiON, HfON, HfAlO, $ZrO_2$, $Ta_2O_3$, $HfTa_xO_y$, LaO, LaAlO, LaHfO, and/or HfAlO. The tunneling insulating layer 142, the charge storage layer 144, and the blocking insulating layer 146 form the storage cells 150. The storage cells 150 may be arranged in a NAND configuration.

A gate electrode layer 148 is formed on the blocking insulating layer 146. The gate electrode layer 148 may include, for example, polysilicon, aluminum (Al), ruthenium (Ru), TaN, TiN, tungsten (W), WN, HfN, and/or WSi.

Figure 7:
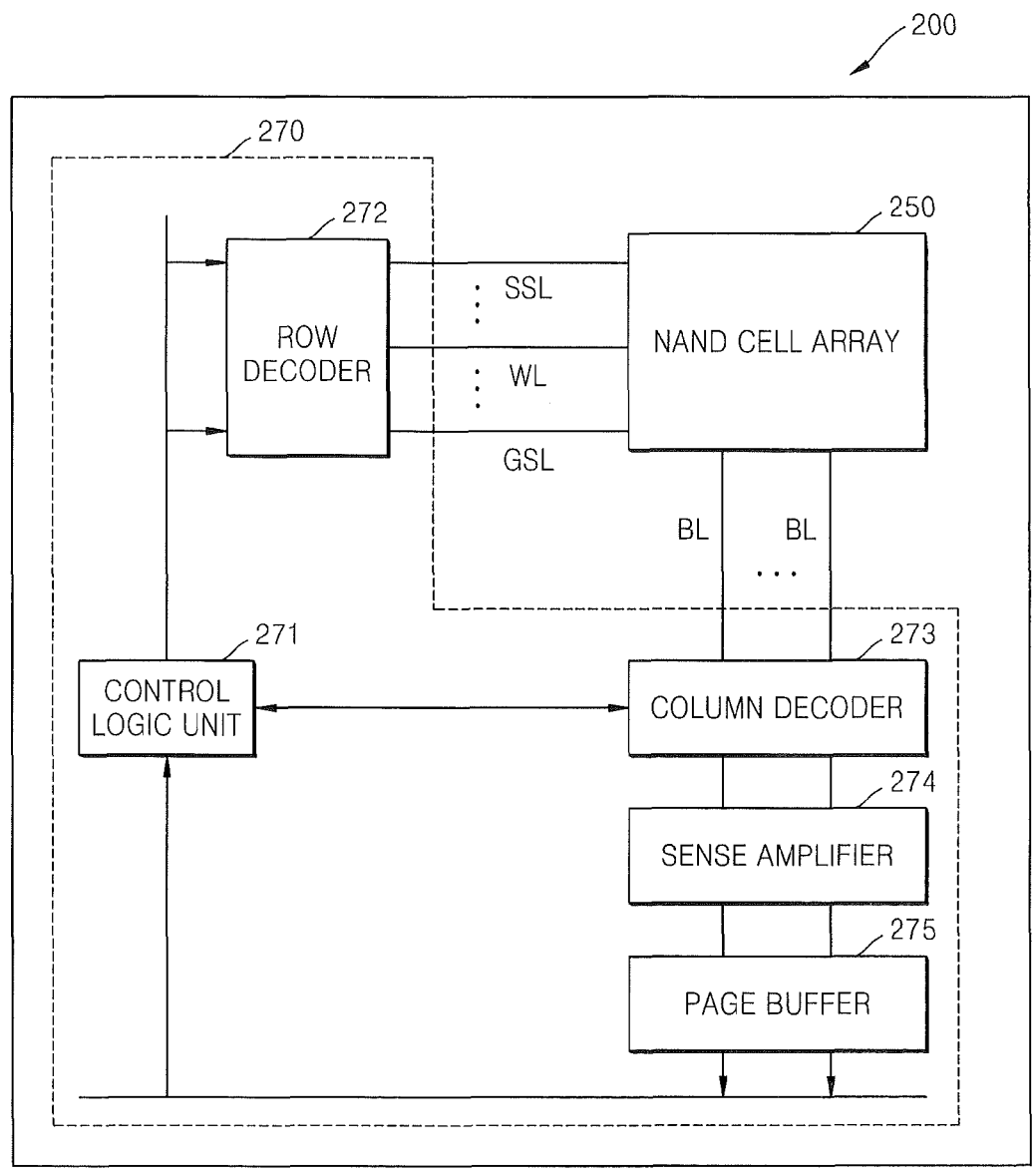
FIG. 7 is a schematic block diagram of a non-volatile memory device having a vertical structure according to some embodiments of the inventive subject matter.

FIG. 7 is a schematic block diagram of a non-volatile memory device 200 having a vertical structure according to some embodiments of the inventive subject matter.

Referring to FIG. 7, a NAND cell array 250 may be combined with a core circuit unit 270. For example, the NAND cell array 250 may include one of the non-volatile memory devices having a vertical structure according to the above embodiments. The core circuit unit 270 may include a control logic unit 271, a row decoder 272, a column decoder 273, a sense amplifier 274 and/or a page buffer 275.

The control logic unit 271 may communicate with the row decoder 272, the column decoder 273 and/or the page buffer 275. The row decoder 272 may communicate with the NAND cell array 250, which has a stacked structure, via string selection lines SSL, word lines WL and/or ground selection lines GSL. The column decoder 273 may communicate with the NAND cell array 250 via bit lines BL. The sense amplifier 274 may be electrically connected to the column decoder 273 when it receives a signal from the NAND cell array 250 and may be electrically disconnected from the column decoder 273 when it transmits a signal to the NAND cell array 250. For example, the control logic unit 271 may transmit a row address signal to the row decoder 272, and the row decoder 272 may decode the row address signal and transmit the decoded signal to the NAND cell array 250 via the string selection lines SSL, the word lines WL, and the ground selection lines GSL. The control logic unit 271 may transmit a column address signal to the column decoder 273 or the page buffer 275, and the column decoder 273 may decode this signal and transmit the decoded signal to the NAND cell array 250 via the bit lines BL. A signal output from the NAND cell array 250 having the stacked structure may be delivered to the sense amplifier 274 via the column decoder 273 and be amplified by the sense amplifier 274, and the result of amplification may be delivered to the control logic unit 271 via the page buffer 275.

Figure 8:
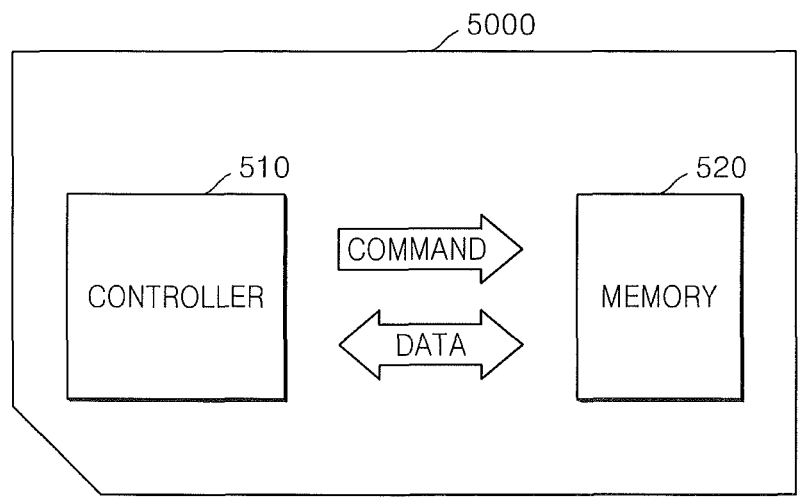
FIG. 8 is a schematic block diagram of a memory card according to some embodiments of the inventive subject matter.

FIG. 8 is a schematic block diagram of a card 5000 according to some embodiments of the inventive subject matter. Referring to FIG. 8, in the card 5000, a controller 510 and a memory unit 520 may be disposed to exchange an electrical signal with each other. For example, data may be transmitted from the memory unit 520 in response to a command received from the controller 510. The memory unit 520 may include one of the non-volatile memory devices having a vertical structure according to the above embodiments. A memory card 400 (not shown) may be used as a data storage medium in various portable apparatuses. It would be apparent to those of ordinary skill in the art that the non-volatile memory devices having a vertical structure according to the above embodiments may be arranged in NAND and NOR architecture memory arrays (not shown) according to a desired logic gate design. At least one memory array bank (not shown) may be fabricated using a memory array with a plurality of rows and columns. The memory unit 520 may include such a memory array or memory array bank. Although not shown, the card 5000 may further include a row decoder, a column decoder, input/output (I/O) buffers, and/or a control register so as to drive such a memory array bank. The card 5000 may be used in a memory device, such as a memory stick card, a smart media (SM) card, a secure digital (SD) card, a mini SD card, or a multi media card (MMC).

Figure 9:
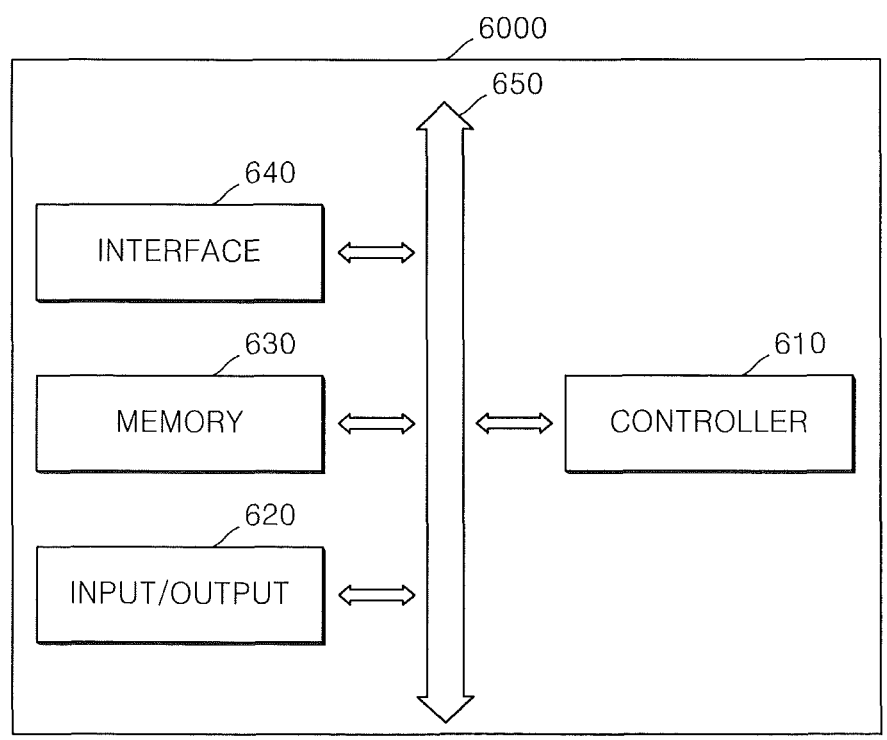
FIG. 9 is a schematic block diagram of a system according to some embodiments of the inventive subject matter.

FIG. 9 is a schematic block diagram of a system 6000 according to some embodiments of the inventive subject matter. Referring to FIG. 9, the system 6000 may include a controller 610, an input/output (I/O) device 620, a memory unit 630, and an interface unit 640. The system 6000 may be a mobile system or may be a system that can transmit and receive information. The mobile system may be a personal digital assistant (PDA), a portable computer, a web tablet, a wireless phone, a mobile phone, a digital music player, or a memory card. The controller 610 may execute a program and control the system 6000. The controller 610 may be a microprocessor, a digital signal processor, a microcontroller, or the like. The I/O device 620 may be used in order to input data to or output data from the system 6000. The system 6000 may be connected to an external device, e.g., a personal computer (PC) or a network, in order to exchange data with the external device via the I/O device 620. The I/O device 620 may be a keypad, a keyboard, or a display. The memory unit 630 may store code and/or data for operating the controller 610. The memory unit 630 may include one of the non-volatile memory devices according to the above embodiments. The interface unit 640 may be a path via which data is exchanged between the system 6000 and an external device. The controller 610, the I/O device 620, the memory unit 630, and the interface unit 640 may communicate with one another via a bus 650. For example, the system 6000 may be used in a mobile phone, an MP3 player, a navigation device, a portable multimedia player (PMP), a solid state disk (SSD), or household appliances.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A memory device comprising:
   a substrate;
   a semiconductor column longitudinally extending from the substrate in a first direction perpendicular to the substrate;
   a plurality of interlayer insulating layers disposed on a sidewall of the semiconductor column and spaced apart along the first direction and having surfaces oriented perpendicular to the semiconductor column;
   a plurality of charge storage cells disposed on the sidewall of the semiconductor column, respective ones of which are disposed between adjacent ones of the interlayer insulating layers, each of the charge storage cells comprising:
      a tunneling insulating layer disposed on and contacting the sidewall of the semiconductor column and separated from the tunneling layer of any other charge storage cell;
      a polymer layer linearly extending on the tunneling insulating layer in the first direction;
      a plurality of quantum dots disposed on or in the polymer layer; and
      a blocking insulating layer disposed on the polymer layer and contacting the surfaces of adjacent ones of the interlayer insulating layers; and
   a plurality of gate electrodes, respective ones of which are disposed on respective ones of the charge storage cells.

2. The memory device of claim 1, wherein the polymer layer extends along the sidewall of the semiconductor column to contact adjacent ones of the interlayer insulating layers and wherein the blocking insulating layer conforms to the polymer layer and extends on to and directly contacts the surfaces of the adjacent interlayer insulating layers perpendicular to the sidewall of the semiconductor column.

3. The memory device of claim 1, wherein the substrate comprises a conductive layer and wherein the semiconductor column is disposed on and directly in contact with the conductive layer.

4. The memory device of claim 1:
   wherein the semiconductor column comprises a plurality of semiconductor columns arrayed on the substrate;
   wherein the plurality of spaced-apart charge storage cells comprises respective pluralities of charge storage cells spaced along sidewalls of respective ones of the semiconductor columns; and
   wherein the plurality of gate electrodes comprises a plurality of gate electrode layers, respective ones of which are disposed between adjacent ones of the interlayer insulating layers.

5. A memory device comprising:
   a semiconductor layer;

at least one semiconductor column extending along a first direction perpendicular to the semiconductor layer;

a plurality of interlayer insulating layers spaced along a sidewall of the at least one semiconductor column and having surfaces extending in a second direction perpendicular to the first direction; and a plurality of storage cells disposed along the sidewall of the at least one semiconductor column between adjacent ones of the interlayer insulating layers, each of the plurality of storage cells comprising:

a charge storage layer comprising a polymer layer and quantum dots bonded thereto, the polymer layer linearly extending along the sidewall of the semiconductor column in the first direction; and a blocking insulating layer disposed on the polymer layer wherein the blocking insulating layer conforms to the polymer layer and contacts the surfaces of adjacent ones of the interlayer insulating layers a tunneling insulating layer disposed on and contacting the sidewall of the semiconductor column and separated from the tunneling layer of any other charge storage cell.

6. The memory device of claim 5, wherein the charge storage layers extend along the sidewall of the semiconductor column in the first direction.

7. The memory device of claim 5, wherein the quantum dots are configured to trap charge.

8. The memory device of claim 5, wherein the quantum dots are disposed on and/or in the polymer layer.

9. The memory device of claim 5, wherein the quantum dots are bonded to ligands of the polymer layer.

10. The memory device of claim 5, wherein respective tunneling insulating layers are disposed between respective ones of the charge storage layers and the semiconductor column.

11. The memory device of claim 5, wherein the storage cells are symmetrically arranged on respective first and second sides of the at least one semiconductor column.

12. The memory device of claim 5, wherein respective ones of the storage cells are disposed between adjacent ones of the interlayer insulating layers.

13. The memory device of claim 5, wherein the blocking insulating layers extend on to and directly contact the surfaces of the interlayer insulating layers along the second direction.

14. The memory device of claim 5, further respective gate electrode layers on respective ones of the blocking insulating layers.

15. The memory device of claim 14, wherein the at least one semiconductor column, the storage cells and the gate electrode layers form a NAND string.

16. The memory device of claim 15, further comprising at least one selection transistor disposed proximate an end of the semiconductor column.

17. The memory device of claim 15, further comprising a common source region connect to the at least one semiconductor column.

18. A memory device comprising:

a semiconductor layer;

at least one semiconductor column longitudinally extending in a first direction perpendicular to the semiconductor layer;

a plurality of interlayer insulating layers spaced apart along the first direction and having surfaces extending in a second direction perpendicular to the first direction; and a plurality of charge storage structures disposed between adjacent ones of the interlayer insulating layers and comprising:

a plurality of polymer layers disposed on a sidewall of the semiconductor column wherein the plurality of polymer layers linearly extends along the sidewall of the semiconductor column in the first direction;

a plurality of quantum dots bonded to the plurality of polymer layers; and a plurality of blocking insulating layers disposed on the plurality of polymer layers wherein the plurality of blocking insulating layers conforms to the plurality of polymer layers and contacts the surfaces of adjacent ones of the interlayer insulating layers a tunneling insulating layer disposed on and contacting the sidewall of the semiconductor column and separated from the tunneling layer of any other charge storage cell.

* * * * *